(12) United States Patent
Ariga

(10) Patent No.: US 8,922,404 B2
(45) Date of Patent: Dec. 30, 2014

(54) SIGNAL PROCESSOR

(71) Applicant: Kabushiki Kaisha Toshiba, Minato, Tokyo (JP)

(72) Inventor: Hiroshi Ariga, Kanagawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/189,356

(22) Filed: Feb. 25, 2014

(65) Prior Publication Data

US 2014/0354457 A1 Dec. 4, 2014

(30) Foreign Application Priority Data

May 28, 2013 (JP) ................. 2013-111434

(51) Int. Cl.
*H03M 1/06* (2006.01)
*H03M 1/12* (2006.01)
*H03M 1/00* (2006.01)
*G01D 5/347* (2006.01)

(52) U.S. Cl.
CPC .............. *H03M 1/06* (2013.01); *H03M 1/1225* (2013.01); *H03M 1/00* (2013.01); *G01D 5/34792* (2013.01); *H03M 1/12* (2013.01); *G01D 5/34715* (2013.01)
USPC ........................................... 341/118; 341/13

(58) Field of Classification Search
CPC ........... H03M 1/06; H03M 1/12; H03M 1/00; H03M 1/1225; G01D 5/34792; G01D 5/34715
USPC .......................... 341/120, 118, 155, 156, 141; 250/231.13, 231.18
See application file for complete search history.

(56) References Cited

U.S. PATENT DOCUMENTS 7,825,369 B2 * 11/2010 Hane ..................... 250/237 G

FOREIGN PATENT DOCUMENTS

JP 7-294285 A 11/1995
JP 11-241927 A 9/1999

* cited by examiner

*Primary Examiner* — Joseph Lauture
(74) *Attorney, Agent, or Firm* — White & Case LLP

(57) ABSTRACT

An aspect of one embodiment, there is provided a signal processor includes an AD-convertor outputting a conversion result and a conversion end flag, a second comparator configured to compare signal levels, a channel selection signal generation unit to select an input channel to input the AD-convertor, an direction identification flag generation unit to generate an direction identification flag, an edge signal generation unit to generate rising edges and lowering edges, an up-down counter to subject to be up or down on a count value in an output of each of edge signals, and an arithmetic processing unit to interlink the count value of the up-down counter and the conversion result of the AD-convertor to generate output data, wherein the arithmetic processing unit interpolates the count value of the up-down counter in the interlinking by using a correction value corresponding to a value of the direction identification flag in a period between an output of the edge signal and an output of the conversion end flag.

10 Claims, 6 Drawing Sheets

| A>B | BN>A | INPUT CHANNEL |
|---|---|---|
| 0 | 0 | ch0 |
| 1 | 0 | ch1 |
| 1 | 1 | ch2 |
| 0 | 1 | ch3 |

FIG.3

SIGNAL PROCESSOR

CROSS REFERENCE TO RELATED APPLICATION

This application is based upon and claims the benefit of priority from prior Japanese Patent Application No. 2013-111434, filed on May 28, 2013, the entire contents of which are incorporated herein by reference.

FIELD

Exemplary embodiments described herein generally relate to a signal processor.

BACKGROUND

In position detection with respect to a linear motor car or the like, signal processing is conducted to obtain a position detection signal. In the signal processing, two-phase sine wave with a phase difference of ninety degree outputted from a sensor unit is utilized.

A signal processor including a counter and an AD-convertor has been conventionally utilized to digitally process such the signal processing. In the signal processor, the counter counts an edge of the binary two-phase signal and the AD-convertor converts a signal level of the two-phase signal between the edges.

In the signal processor, a period of one count of the counter is interpolated by output data of the AD-convertor, so that a position detection resolution can be improved.

However, an AD-convertor processing by the AD-convertor generally consumes time. Therefore, an output from the AD-inverter is delayed not to correctly count value transformation of the counter in the binary two-phase signal. Accordingly, it has been a problem that the count value of the counter may be not correctly interpolated.

BRIEF DESCRIPTION OF THE DRAWINGS

FIG. 3 is a table showing an example of an input channel selection of the AD-convertor in the signal processor according to the embodiment;

DETAILED DESCRIPTION

Figure 1:
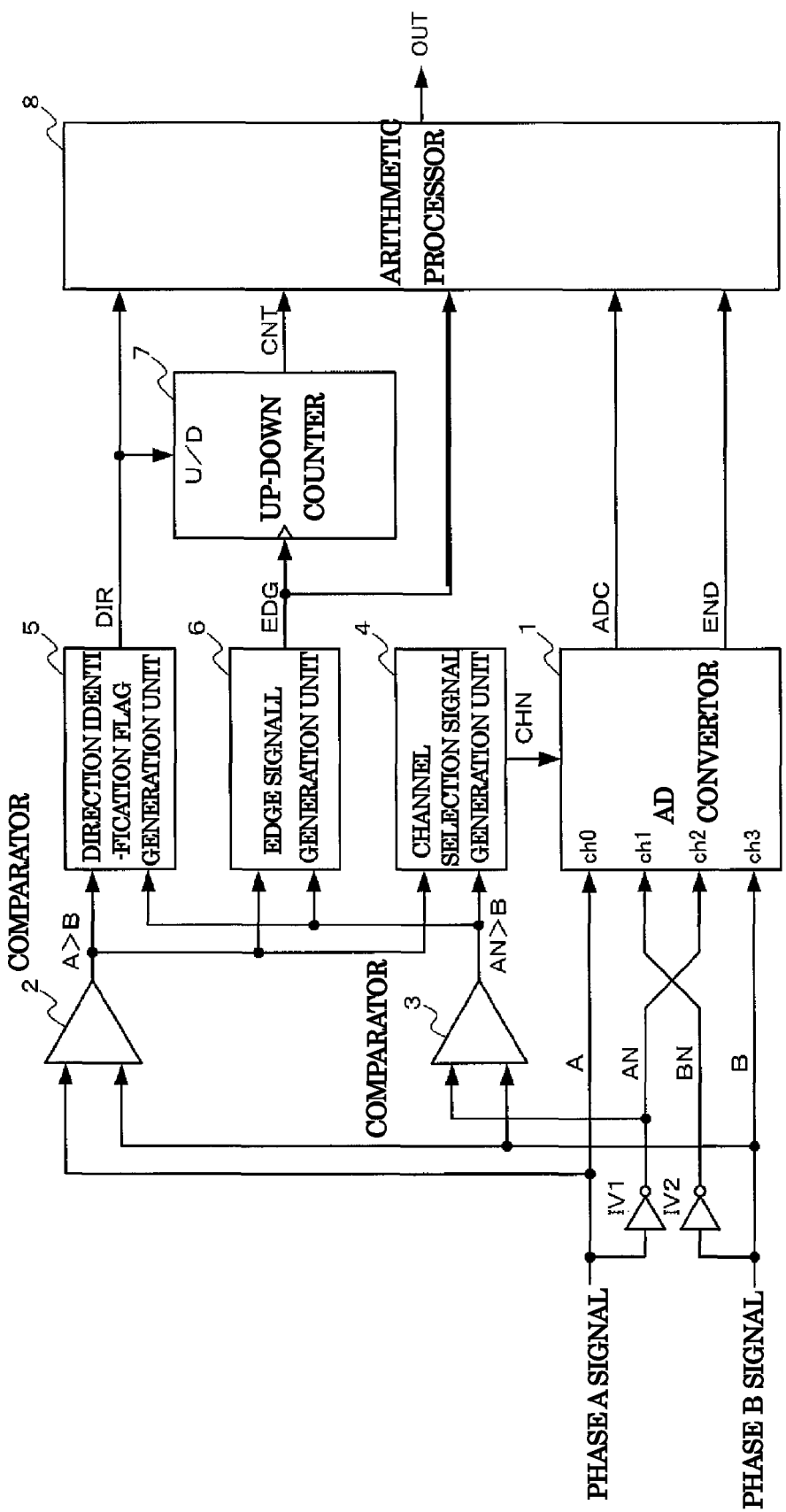
FIG. 1 is a block diagram showing a constitution of a signal processor according to an embodiment.

An aspect of one embodiment, there is provided a signal processor includes an AD-convertor having a plurality of input channels and outputting a conversion result and a conversion end flag when an AD-conversion is ended, each channel of the AD-convertor configured to be inputted a first signal, a second signal, a first inverse signal and second inverse signal, the second signal having a phase difference with ninety degrees to the first signal, a phase of the first inverse signal being inversed to a phase of the first signal, a phase of the second inverse signal being inversed to a phase of the second signal, a first comparator configured to compare signal levels of the first signal and the second signal to output a first comparison signal, a second comparator configured to compare signal levels of a first inverse signal and the second signal to output a second comparison signal, a channel selection signal generation unit configured to select an input channel to input the AD-convertor on a basis of signal values of the first comparison signal and the second comparison signal, an direction identification flag generation unit configured to generate an direction identification flag on a basis of a phase relation between the first comparison signal and the second comparison signal, an edge signal generation unit configured to generate rising edges and lowering edges of the first comparison signal and the second comparison signal, an up-down counter configured to subject to be up or down on a count value in an output of each of edge signals using the direction identification flag as an up-down exchange signal, and an arithmetic processing unit configured to interlink the count value of the up-down counter and the conversion result of the AD-convertor to generate output data, wherein the arithmetic processing unit interpolates the count value of the up-down counter in the interlinking by using a correction value corresponding to a value of the direction identification flag in a period between an output of the edge signal and an output of the conversion end flag.

Embodiments will be described below in detail with reference to the attached drawings mentioned above.

Throughout the attached drawings, similar or same reference numerals show similar, equivalent or same components, and the description is not repeated.

EMBODIMENT

A signal processing is explained below in a case of a two-phase signal including a phase difference of 90 degrees. In the case, an A-phase signal and a B-phase signal outputted from a sensor to detect a position of an objective body are inputted.

Figure 2:
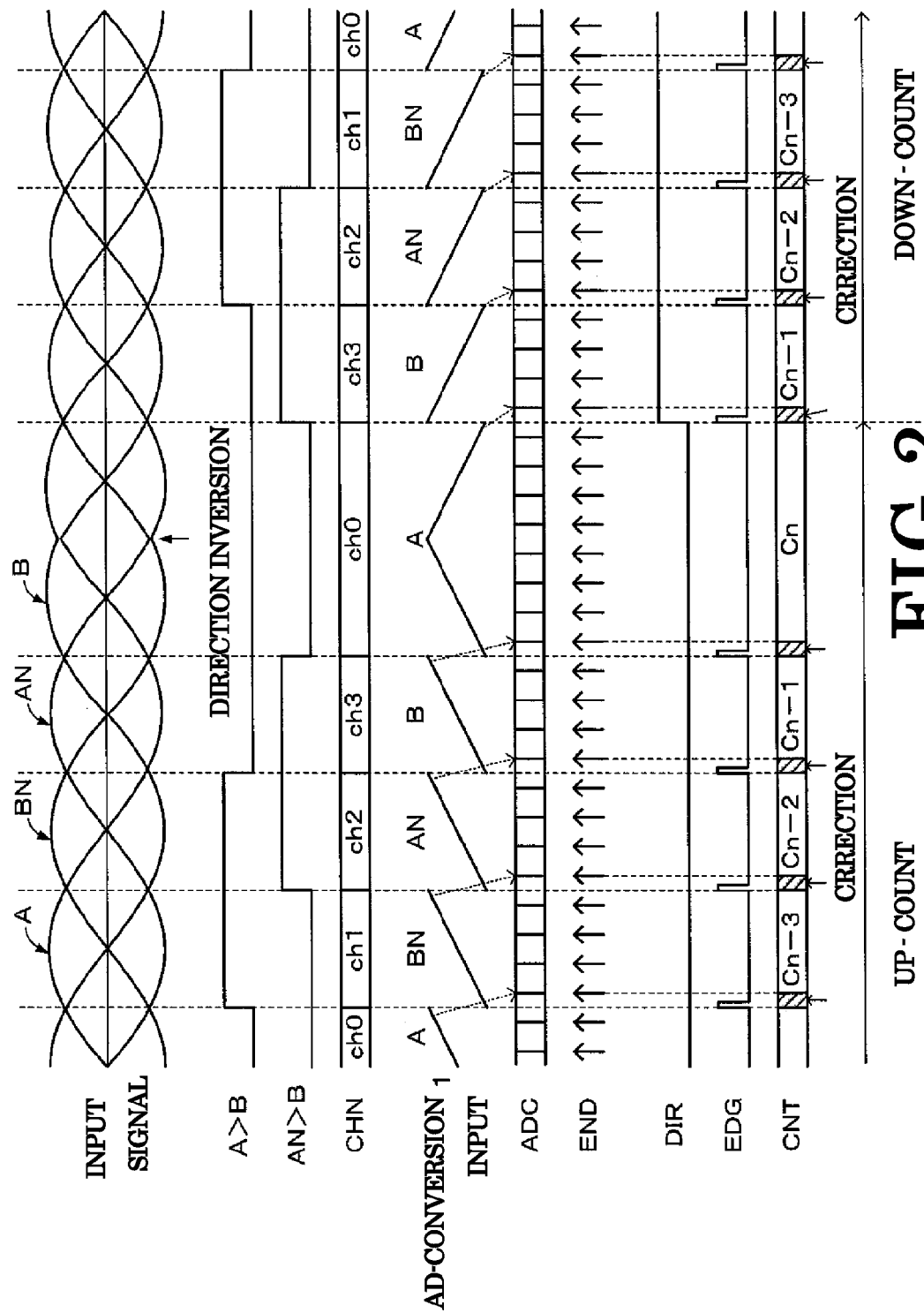
FIG. 2 is a wave form diagram showing an action of the signal processor according to the embodiment.

FIG. 1 is a block diagram showing a constitution of the signal processor according to the embodiment. FIG. 2 is a wave form diagram showing an action of the signal processor according to the embodiment. The constitution and the action of the signal processor are explained by using FIGS. 1, 2.

As shown in FIG. 1, a signal processor in the embodiment includes an inverters IV1, IV2, an AD convertor 1, comparators 2, 3, a channel selection signal unit 4, an edge signal generation unit 6, an up-down counter 7 and an arithmetic processing unit 8.

The inverter IV1 inverses an A-phase signal (signal A, hereinafter) to output an inverse A-phase signal (signal AN, hereinafter). The inverter IV inverse a B-phase signal (signal B, hereinafter) to output an inverse B-phase signal (signal BN, herein after). The AD convertor 1 includes a plurality of input channels, each of the input channels are inputted into each of a signal A, a signal AN, a signal B and signal BN, respectively, and outputs a conversion result ADC and a conversion ending flag END after ending the AD-conversion. The comparator 2 compares signal levels of the signal A and the signal B to output a comparison signal A>B. The comparator 3 compares signal levels of the signal AN and the signal B output a comparison signal AN>B. The channel selection signal unit 4 generates a channel selection signal CHN selecting the input channel of the AD-convertor on a basis of signal values of the comparison signal A>B and the comparison signal AN>B. The direction identification flag generation unit 5 generates a direction identification flag DIR on a basis of a phase relation of the comparison signal A>B and comparison signal AN>B. The edge signal generation unit 6 generates an edge signals EDG showing a rising edge and a lowering edge of the comparison signal A>B and the comparison signal AN>B. The up-down counter 7 subjects to be up or down a count value CNT with respect to each output of the edge signal EDG by using the direction identification flag DIR as an up-down exchange signal. The arithmetic processing unit 8 interlinks the count value CNT of the up-down counter 7 and the conversion result of the AD-convertor 1 to output data as output data OUT.

In the AD-convertor 1, a signal A, a signal BN, a signal AN, and a signal B are inputted. In the AD-convertor 1, the signal A in an input channel ch0, the signal BN in an input channel ch1, the signal AN in an input channel ch2 and the signal B in an input channel ch3 are inputted. An input channel to be inputted in the AD-convertor is selected by a selection signal CHN outputted from the channel selection signal unit 4. The AD-convertor 1 outputs a conversion result ADC and a conversion end flag END when the AD-conversion with respect to the signal inputted to the selected channel is finished.

The comparator 2 compares signal levels of the signal A and the signal B to output a comparison signal A>B, which is set as a value "1", when the signal level of the signal A is larger than that of the signal B as shown in FIG. 2.

The comparator 3 compares signal levels of the signal AN and the signal B to output a comparison signal AN>B, which is set as a value "1", when the signal level of the comparison signal AN is larger than that of the comparison signal B as shown in FIG. 2.

The channel selection signal unit 4 generates the channel selection signal CHN selecting the input channel of the AD-convertor 1 on a basis of a combination of the comparison signal A>B and the comparison signal AN>B.

As shown in FIG. 3, a relation between a combination of the signal values of both the comparison signal A>B and the comparison signal AN>B and the input channels of the AD-convertor 1 selected by the channel selection signal CHN.

As shown in FIG. 2, each of approximate straight line portions of the signal A, the signal BN, the signal AN and the signal B is inputted into the AD-convertor due to the input channel selection by the channel selection signal CHN.

The direction identification flag generation unit 5 generates a direction identification flag DIR on a basis of a difference relation between the comparison signal A>B and the comparison signal AN>B. The direction identification flag DIR indicates that a body of a position detection object transfers to a positive direction or a negative direction with respect to a prescribed standard, for example.

The direction identification flag DIR indicates that the positive direction and the negative direction are indicated as the value "0" and the "1", respectively, for example, in FIG. 2.

Furthermore, when the body of the position detection object is inversed, the phase relation between the signal A and the signal B is also turned to be inversed. Accordingly, each of slopes of the approximate straight line portions in the signal A, the signal BN, the signal AN and the signal B inputted into the AD-convertor 1 is also turned to be inversed.

Namely, the approximate straight line portion is gradually increased when the direction identification flag DIR is set to be the value "0" (positive direction), and the approximate straight line portion is gradually decreased when the direction identification flag DIR is set to be the value "1" (negative direction).

The edge signal generation unit 6 generates the edge signal EDG with a pulse state in each of the rising edge and the lowering edge in the comparison signal A>B and the comparison signal AN>B.

The up-down counter 7 subject the count value CNT to be set upwards or downwards in each of the outputs of the edge signal by using the direction identification flag DIR as the up-down exchanging signal.

As shown in FIG. 2, the up-down counter 7 subjects the count value CNT to be set upwards to values Cn−3, Cn−2, Cn−1 and Cn when the direction identification flag DIR is set to be the value "0" (positive direction) and subjects the count value CNT to be set downwards to values Cn, Cn−1, Cn−2 and Cn−3 when the direction identification flag DIR is set to be the value "1" (negative direction), for example.

The arithmetic processing unit 8 interlinks the count value CNT of the up-down counter 7 and the conversion result ADC of the AD-convertor 1 to generate the output data OUT.

In the embodiment, the AD-convertor 1 conduct a plurality of the AD-conversions to interpolate a value between one count value and the next count value in the up-down counter 7.

On the other hand, a processing period to be consumed in an AD-conversion by the AD-convertor is longer as compared to a processing period to be consumed in a count transfer of the up-down counter 7. Accordingly, a conversion result of the final conversion in one count value of the up-down counter 7 is outputted in the next count value.

As a result, the count value of the up-down counter 7 may not be correctly interpolated when the count value CNT of the up-down counter 7 and the conversion result ADC of the AD-convertor 1 are normally interlinked.

In such a manner, the arithmetic processing unit 8 interpolates the count value CNT of the up-down counter 7 in a period between an output of the edge signal EDG which changes the count value CNT of the up-down counter 7 and an output of the conversion end flag END from the AD-convertor 1.

In the above processing, the correction value used as the correction is different in a case that up-down counter 7 is set to be in the up-count or the down count.

As a result, the correction value is determined to be as a different value according to the direction identification flag DIR being the value "1" or the value "0".

The correction value is set to be a value <−1> when the direction identification flag DIR is the value "0" and is set to be a value <+1> when the direction identification flag DIR is the value "1", for example, in the embodiment.

Figure 4:
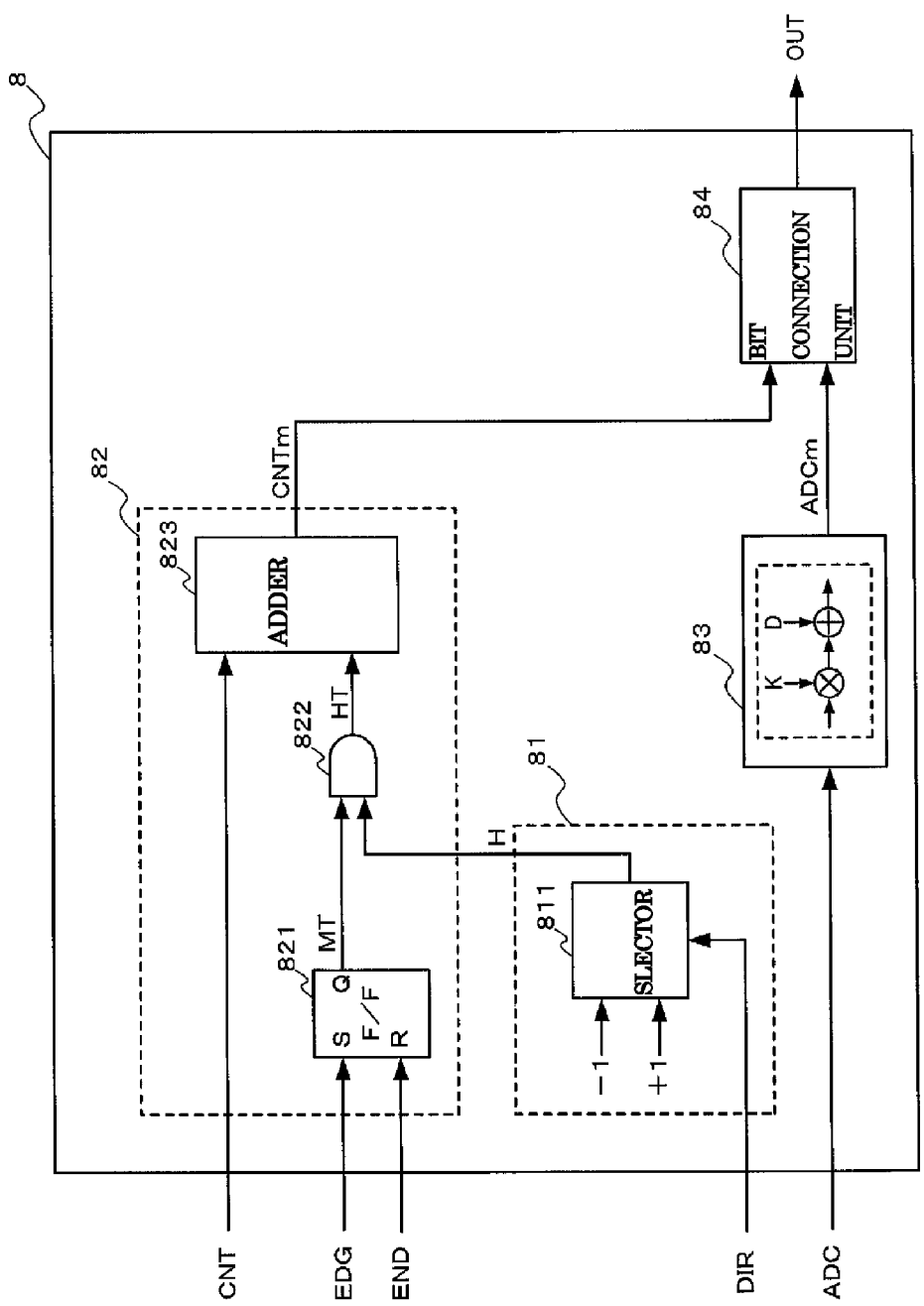
FIG. 4 is a block diagram showing a constitution of an arithmetic processing unit in the signal processor according to the embodiment.

FIG. 4 is the arithmetic processing unit 8 specifically showing a constitution therein.

The arithmetic processing unit 8 as shown in FIG. 4 includes a correction value generation unit 81, a correction unit 82, an adjustment unit 83 and a bit connection unit 84. The correction value generation unit 81 generates a correction value H corresponding to a value of the direction identification flag DIR. The correction unit 82 is added the correction value H to the count value CNT of the up-down counter 7 in a period between the output of the edge signal EDG and the output of the conversion end flag END to output a correction count value CNTm. The adjustment unit 83 adjusts a level of the conversion result ADC of the AD-convertor 1. The bit connection unit 84 interlinks between bits by using the correction count values CNTm outputted from the correction unit 82 as the upper-side bit column and the result of the AD-conversion ADCm adjusted in the adjustment unit 83 as the lower-side bit column.

The correction value generation unit 81 includes a selector 811. The selector 811 selects one of an input <+1> or an input <−1> using the direction identification flag DIR as a selection signal to output the selected input as the correction value H. The correction value H is set to be a value <−1> when the direction identification flag DIR is set to be the value "0" and is set to be a value <+1> when the direction identification flag DIR is set to be the value "1".

The correction unit 82 includes an SR-type flip-flop (F/F) 821, an AND-type gate 822 and an adder 823. The F/F 821 utilizes the edge signal EDG as a set signal and the conversion end flag END as a reset signal. The AND-type gate 822 is inputted an output MT and the correction value H outputted from the correction value generation unit 81. The adder 823 adds the output MT to the count value CNT of the up-down counter 7 to output the correction count value CNTm.

The adjustment unit 83 utilizes the conversion result ADC of the AD-convertor 1 in the interpolation of the count value of the up-down counter 7. Accordingly, the adjustment unit 83 conducts a processing step by a function F to the result of the AD-conversion ADC to adjust a level of the result of the AD-conversion. In the processing steps, a level range of the approximate straight line portion inputted in the AD-convertor 1 is interpolated, as the count value of the up-down counter 7 is narrower than all amplitude ranges of the A-phase signal and the B-phase signal. A formula $F=K-ADC+D$ is utilized as the function F.

The bit connection unit 84 interlinks between bits by using the count value CNTm outputted from the correction unit 82 as the upper-side bit column and the result of the AD-conversion ADCm adjusted in the adjustment unit 83 as the lower-side bit column.

Figure 5:
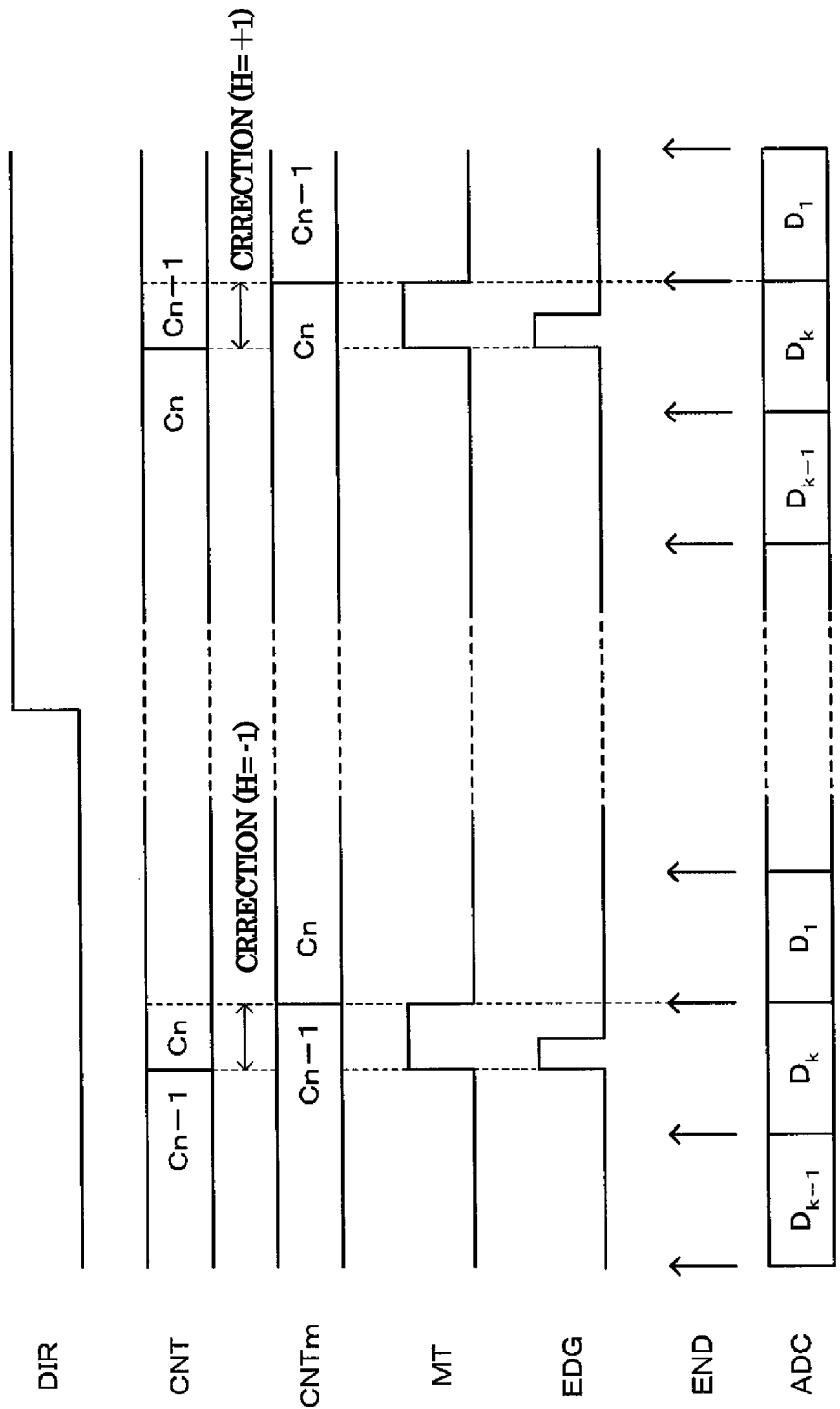
FIG. 5 is a wave form diagram showing an action of the arithmetic processing unit in the signal processor according to the embodiment.

FIG. 5 is a wave diagram showing an action of the arithmetic processing unit 8, for example.

It is configured on processing steps described below that the AD-convertor 1 are conducted k times of the AD-conversions in one count period of the up-down counter 7, for example.

The count value CNT in the up-down counter 7 is up to be the value Cn from the value Cn−1 when the direction identification flag DIR is set to be the value "0" by the output of the edge signal EDG. In such the situation, the conversion end flag END corresponding to a k-th AD-conversion ADk of the count value Cn−1 is outputted after the edge signal EDG is outputted.

Consequently, the output MT of the F/F 821 in the correction unit 82 is set to be the value "1" between the output of the edge signal EDG and the output of the conversion end flag END corresponding to the k-th AD-conversion ADk.

The correction value H is outputted to the output HT of the AND-type gate 822 in the correction unit 82 in the period of the output HT being set to be the value "1". As the identification flag DIR is set to be the value "0", the correction value H outputted from the correction value generation unit 81 is set to be the value <−1>.

Therefore, the adder 823 in the correction unit 82 adds the correction value <−1> to the count value Cn of the up-down counter 7 to output a correction count value Cn−1.

Namely, the correction count value CNTm outputted from the adder 823 is set to be the value Cn−1 during a state of outputting the conversion result of the k-th AD-conversion of the count value Cn−1 in the up-down counter 7.

As the same as the above situation, in a case that the count value CNT of the up-down counter 7 is down to the value Cn−1 from the value Cn when the direction identification flag DIR is set to be the value "1", the adder 823 adds the correction value <+1> to the count value Cn−1 of the up-down counter 7 to output a correction count value Cn in a period between the output of the edge signal EDG and the output of the conversion end flag END of the k-th AD-conversion ADk, namely, the output MT being set to be the value "1".

The correction count value CNTm outputted from the correction unit 82 is interlinked with the result of the AD conversion ADCm outputted from the adjustment unit 83 after adjusting the level by the bit connection unit 84.

Figure 6:
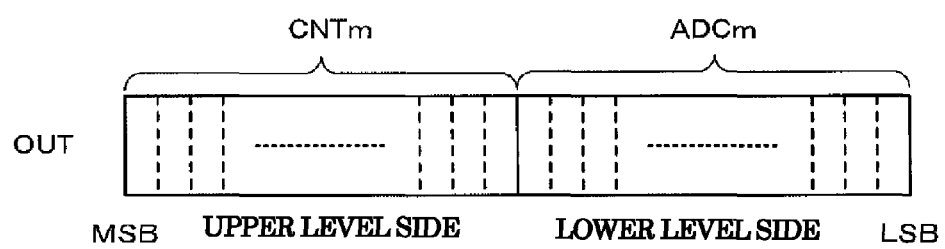
FIG. 6 is a diagram showing example of bit columns in output data.

FIG. 6 is a diagram showing an example of bit columns of the output data after interlinking with bits by the bit connection unit 84.

The bit connection unit 84 interlinks between the bits by using the correction count value CNTm as the upper-side bit column and the result of the AD-conversion ADC after the level adjustment as the lower-side bit column.

In the delay period, the count value CNT of the up-down counter 7 is corrected so that the correction count value CNTm after the correction is interlinked with the conversion result ADC of the AD convertor 1, where the conversion result ADC of the AD convertor 1 is delayed to be outputted corresponding to the transformation of the count value CNT of the up-down counter 7. In such a manner, one count period of the up-down counter 7 can be correctly interpolated by the AD convertor 1.

As described above, the signal processor according to the embodiment, the count value of the counter can be correctly interpolated even when the output of the AD-convertor 1 is delayed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A signal processor, comprising:
an AD-convertor having a plurality of input channels and outputting a conversion result and a conversion end flag when an AD-conversion is ended, each channel of the AD-convertor configured to be inputted a first signal, a second signal, a first inverse signal and second inverse signal, the second signal having a phase difference with ninety degrees to the first signal, a phase of the first inverse signal being inversed to a phase of the first signal, a phase of the second inverse signal being inversed to a phase of the second signal;
a first comparator configured to compare signal levels of the first signal and the second signal to output a first comparison signal;
a second comparator configured to compare signal levels of a first inverse signal and the second signal to output a second comparison signal;
a channel selection signal generation unit configured to generate a channel selection signal to select an input channel in the AD-convertor on a basis of signal values of the first comparison signal and the second comparison signal;
an direction identification flag generation unit configured to generate an direction identification flag on a basis of a phase relation between the first comparison signal and the second comparison signal;

an edge signal generation unit configured to generate rising edges and lowering edges of the first comparison signal and the second comparison signal;

an up-down counter configured to subject to be up or down on a count value in an output of each of edge signals using the direction identification flag as an up-down exchange signal; and an arithmetic processing unit configured to interlink the count value of the up-down counter and the conversion result of the AD-convertor to generate output data;

wherein the arithmetic processing unit interpolates the count value of the up-down counter in the interlinking by using a correction value corresponding to a value of the direction identification flag in a period between an output of the edge signal and an output of the conversion end flag.

2. The signal processor of claim 1, wherein the AD-convertor conducts a plurality of AD-conversions in a period of one count in the up-down counter.

3. The signal processor of claim 1, wherein the correction value is set to be a value <−1> when the value of the direction identification flag directs to a positive direction and is set to be a value <+1> when the value of the direction identification flag directs to a negative direction.

4. The signal processor of claim 1, wherein the channel selection signal unit generates the channel selection signal where approximate straight line portions of both the first signal and the second signal, and the both first inverse signal and the second signal are inputted into the AD-convertor.

5. The signal processor of claim 4, wherein each of the approximate straight line portions has a gradual increase portion of both the first signal the second signal, and both the first inverse signal and the second signal when the direction identification flag directs to the positive direction and has a gradual decrease portion of both the first signal and the second signal, and both the first inverse signal and the second signal when the direction identification flag directs to the negative direction.

6. The signal processor of claim 1, wherein
The arithmetic processing unit comprises a correction value generation unit to generate the correction value corresponding to the value of the direction identification flag, a correction unit to add the correction value to the count value of the up-down counter between the output of the edge signal and the output of the conversion end flag, and a bit connection unit to interlink the count value outputted from the correction unit as an upper-side bit column and the conversion result of the AD-convertor as a lower-side column.

7. The signal processor of claim 6, wherein the correction value generation unit includes a selector which select an input value <−1> or an input value <+1> on a basis of the direction identification flag to output the selected value as the correction value.

8. The signal processor of claim 6, wherein the correction unit includes a flip-flop using the edge signal as a set signal and the conversion end signal as a reset signal, an AND-type gate being inputted an output of the flip-flop and the correction value outputted from the correction value generation unit, and an adder adding an output of the AND-type gate to the count value of the up-down counter to output the correction count value.

9. The signal processor of claim 6, wherein the arithmetic processing unit further comprises a adjustment unit adjusting a level of the conversion result of the AD-convertor.

10. The signal processor of claim 9, wherein the adjustment unit conducts a processing step using a function F to the conversion result of the AD-conversion to adjust a level of the conversion result.

* * * * *